United States Patent
Lin et al.

(10) Patent No.: US 11,764,982 B2
(45) Date of Patent: Sep. 19, 2023

(54) ETHERNET POWER SUPPLY DEVICE

(71) Applicant: Wistron NeWeb Corp., Hsinchu (TW)

(72) Inventors: Hua Lin, Hsinchu (TW); Sung-Chuan Wu, Hsinchu (TW)

(73) Assignee: WISTRON NEWEB CORP., Hsinchu (TW)

( * ) Notice: Subject to any disclaimer, the term of this patent is extended or adjusted under 35 U.S.C. 154(b) by 189 days.

(21) Appl. No.: 17/349,188

(22) Filed: Jun. 16, 2021

(65) Prior Publication Data

US 2022/0131714 A1    Apr. 28, 2022

(30) Foreign Application Priority Data

Oct. 28, 2020   (TW) .................................. 109137385

(51) Int. Cl.
| | | |
|---|---|---|
| *H04L 12/10* | (2006.01) | |
| *G06F 1/26* | (2006.01) | |
| *H02H 1/00* | (2006.01) | |
| *H03K 7/08* | (2006.01) | |

(52) U.S. Cl.
CPC ............... *H04L 12/10* (2013.01); *G06F 1/26* (2013.01); *H02H 1/0038* (2013.01); *H03K 7/08* (2013.01)

(58) Field of Classification Search
CPC . H04L 12/10; G06F 1/26; G06F 1/263; G06F 1/266; H02H 1/0038; H03K 7/08
See application file for complete search history.

(56) References Cited

U.S. PATENT DOCUMENTS

| | | | | |
|---|---|---|---|---|
| 7,468,567 | B1* | 12/2008 | Yeh ......................... | H02J 1/102 307/64 |
| 10,972,094 | B1* | 4/2021 | Kuo ..................... | H03K 17/693 |
| 2007/0189495 | A1* | 8/2007 | Crawley ................. | H04L 12/10 379/323 |
| 2009/0073957 | A1* | 3/2009 | Newland ................ | H04L 12/10 370/352 |
| 2013/0119768 | A1* | 5/2013 | Chang ....................... | H02J 7/34 307/66 |
| 2015/0019884 | A1* | 1/2015 | Huff ........................ | H04L 12/10 713/300 |
| 2018/0284859 | A1* | 10/2018 | Pant .......................... | H02J 1/08 |

(Continued)

FOREIGN PATENT DOCUMENTS

TW    I594112 B    8/2017

*Primary Examiner* — Jaweed A Abbaszadeh
*Assistant Examiner* — Brian J Corcoran
(74) *Attorney, Agent, or Firm* — McClure, Qualey & Rodack, LLP (57) ABSTRACT

An Ethernet power supply device is provided. The Ethernet power supply device includes a first switch, a second switch, and a processor. When the first switch detects that there is no adapter power supply, the first switch generates a first power supply according to a first network power from a first Ethernet network connector port. When the second switch detects that there is no adapter power supply, the second switch generates a second power supply according to a second network power from the second Ethernet network connector port. When there is no adapter power supply and the first power supply and the second power supply are at the same power level, the processor provides a first control signal to control the first switch to provide the first power supply to a power output terminal as an output power supply.

20 Claims, 8 Drawing Sheets

(56) References Cited

U.S. PATENT DOCUMENTS

2019/0148937 A1\* 5/2019 Kawamoto ............. H02J 1/102
           307/80
2020/0084378 A1\* 3/2020 Kawamoto ............. G06F 1/263

\* cited by examiner

|  | ADP Input | POE1 Input | POE2 Input | Aux_Out |
|---|---|---|---|---|
| State S1 | Present -> Remove | Present | Present | ADP_O -> POE1_O |
| State S2 | Plug In | Present | Present | ADP_O |
| State S3 | Present | Present -> Remove | Present | ADP_O |
| State S4 | Present | Plug In | Present | ADP_O |
| State S5 | Present | Present | Present -> Remove | ADP_O |
| State S6 | Present | Present | Plug In | ADP_O |

|  | ADP Input | POE1 Input | POE2 Input | Aux_Out |
|---|---|---|---|---|
| State S11 | Present -> Remove | Present | Present | ADP_O -> POE2_O |
| State S12 | Plug In | Present | Present | ADP_O |
| State S13 | Absent | Present -> Remove | Present | POE2_O |
| State S14 | Absent | Plug In | Present | POE2_O |
| State S15 | Absent | Present | Present -> Remove | POE2_O -> POE1_O |
| State S16 | Absent | Present | Plug In | POE1_O -> POE2_O |

|  | ADP Input | POE1 Input | POE2 Input | Aux_Out |
|---|---|---|---|---|
| State S21 | Present -> Remove | Present | Present | ADP_O -> POE1_O |
| State S22 | Plug In | Present | Present | ADP_O |
| State S23 | Absent | Present -> Remove | Present | POE1_O -> POE2_O |
| State S24 | Absent | Plug In | Present | POE2_O -> POE1_O |
| State S25 | Absent | Present | Present -> Remove | POE1_O |
| State S26 | Absent | Present | Plug In | POE1_O |

ETHERNET POWER SUPPLY DEVICE

CROSS REFERENCE TO RELATED APPLICATIONS

This application claims priority of Taiwan Patent Application No. 109137385, filed on Oct. 28, 2020, the entirety of which is incorporated by reference herein.

BACKGROUND OF THE INVENTION

Field of the Invention

The invention relates to an Ethernet power supply device, and more particularly to an Ethernet power supply device with multiple switches.

Description of the Related Art

Power Over Ethernet (PoE) technology is based on existing Ethernet cabling infrastructure, which transmits network data to electronic devices that comply with Ethernet specifications (such as IP Phones, wireless network access points, network cameras, etc.), while also using the network cable to provide DC network power (36V~57V) to the electronic products that meet the Ethernet specifications. As a result, the electronic device that meets the Ethernet specifications can get the required power as long as it is connected to the network cable, and the electronic device does not need to be connected to another power supply or batteries to obtain the power it requires.

BRIEF SUMMARY OF THE INVENTION

Ethernet power supply devices are provided. An embodiment of an Ethernet power supply device is provided. The Ethernet power supply device includes a power output terminal configured to provide an output power supply, a connector, a first Ethernet connection port, a first switch coupled between the first Ethernet connection port and the power output terminal, a second Ethernet connection port, a second switch coupled between the second Ethernet connection port and the power output terminal, and a processor. The first switch is configured to detect whether an adapter power supply from the connector is present, and to generate a first power supply according to a first control signal and a first network power from the first Ethernet network connection port when the adapter power supply is absent. The second switch is configured to detect whether the adapter power supply from the connector is present, and generate a second power supply according to a second control signal and a second network power from the second Ethernet network connection port when the adapter power supply is absent. The processor is configured to provide the first control signal and the second control signal. When the adapter power supply is absent and the first power supply and the second power supply have the same power level with different voltages, the processor is configured to provide the first control signal to control the first switch to provide the first power supply to the power output terminal as the output power supply, and voltage of the first power supply is greater than voltage of the second power supply. When the adapter power supply is absent and power level of the second power supply is greater than that of the first power supply, the processor is configured to provide the second control signal to control the second switch to provide the second power supply to the power output terminal as the output power supply.

Furthermore, an embodiment of an Ethernet power supply device is provided. The Ethernet power supply device includes a power output terminal, a connector, a plurality of Ethernet connection ports and a plurality of switches. Each of the switches is coupled between a respective Ethernet connection port and the power output terminal. Each of the switches includes a pulse width modulation (PWM) controller coupled to the Ethernet connection port, a switching device, a first diode, a capacitor coupled between the power output terminal and a ground, a transformer and a first unit coupled to the PWM controller, the power output terminal and the connector. The switching device is controlled by a PWM signal of the PWM controller. The first diode has an anode and a cathode coupled to the power output terminal. The transformer includes a primary coil coupled between the Ethernet connection port and the switching device and a secondary coil coupled between the anode of the first diode and the ground. The first unit is configured to determine whether an adapter power supply of the connector is present. When the first unit determines that the adapter power supply is absent, the transformer is configured to provide an output power supply to the power output terminal according to a network power of the Ethernet connection ports. When the adapter power supply is absent, the output power supply provided by each of the switches has individual voltage level.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
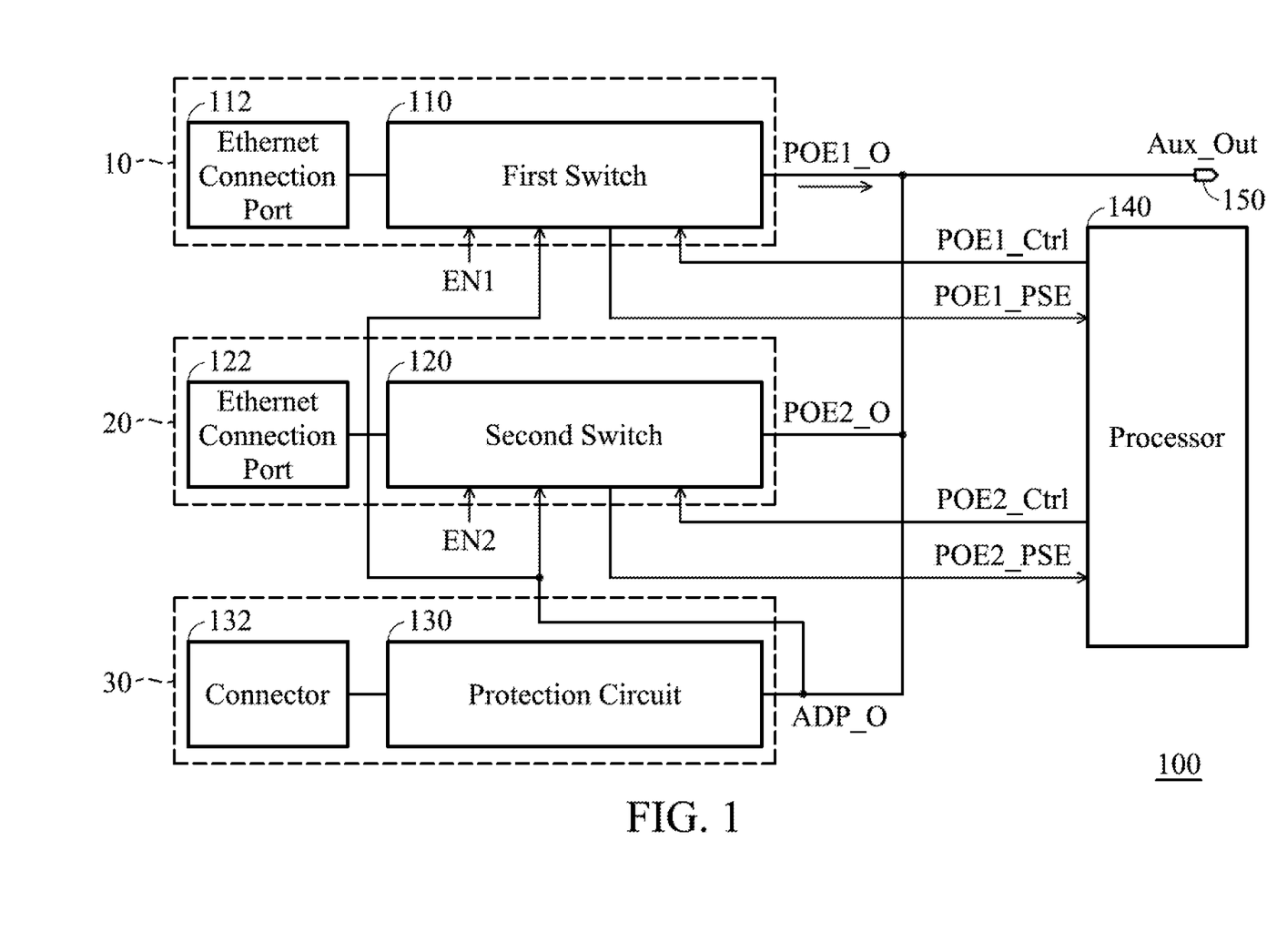
FIG. 1 shows an Ethernet power supply device according to some embodiments of the invention.

FIG. 1 shows an Ethernet power supply device 100 according to some embodiments of the invention. The Ethernet power supply device 100 is a power sourcing equipment (PSE), which is used to provide the output power supply Aux_Out at the power output terminal 150 to a powered device (PD) (not shown). In some embodiments, the power output terminal 150 of the Ethernet power supply device 100 is coupled to the powered device via a network cable.

In FIG. 1, the Ethernet power supply device 100 is configured to provide multiple power supply modes, so that multiple power supply modules are used to provide different power supplies to the power output terminal 150. The Ethernet power supply device 100 includes a first power supply module 10, a second power supply module 20, and a third power supply module 30. The first power supply module 10 and the second power supply module 20 are configured to convert the DC current from the Ethernet cable into various power supplies, and the third power supply module 30 is configured to provide the input power from an adapter to the power output terminal 150. In some embodiments, the Ethernet power supply device 100 may include more power supply modules for converting the direct current from the Ethernet cable into various power supplies. In addition, the Ethernet power supply device 100 further includes a processor (or controller) 140 configured to control the operations of the first power supply module 10, the second power supply module 20, and the third power supply module 30, so as to provide suitable power for the powered device (not shown) to the power output terminal 150. Therefore, the Ethernet power supply device 100 is configured to output the stable output power supply Aux_Out to the powered device through the power output terminal 150.

In FIG. 1, the first power supply module 10 includes an Ethernet connection port 112 and a first switch 110. The first switch 110 is coupled between the Ethernet connection port 112 and the power output terminal 150. After the first switch 110 is enabled by the signal EN1, the first switch 110 is configured to provide the signal POE1_PSE to the processor 140, so as to notify the processor 140 of the setting information of the first switch 110, such as the output power range, related settings and so on. In some embodiments, the signal EN1 is provided by other circuits of the Ethernet power supply device 100, such as a power-on reset (POR) circuit. In some embodiments, the processor 140 may obtain the settings of the first switch 110 in advance. For example, the settings of the first switch 110 is stored in the memory (not shown) of the Ethernet power supply device 100 in advance. According to the setting information of the signal POE1_PSE, the processor 140 is configured to provide the control signal POE1_Ctrl to the first switch 110, so as to control the voltage value, current value, and/or power level of the power supply POE1_O provided by the first switch 110. Therefore, when the Ethernet connection port 112 is connected to the network cable, the first switch 110 is configured to generate the power supply POE1_O corresponding to the control signal POE1_Ctrl according to the control signal POE1_Ctrl. Furthermore, in response to the default value of the control signal POE1_Ctrl, the first switch 110 is configured to generate the power supply POE1_O with a voltage value POE1_V1.

The second power supply module 20 includes an Ethernet connection port 122 and a second switch 120. The second switch 120 is coupled between the Ethernet connection port 122 and the power output terminal 150. After the second switch 120 is enabled by the signal EN2, the second switch 120 is configured to provide the signal POE2_PSE to the processor 140, so as to notify the processor 140 of the setting information of the second switch 120, such as the output power range, settings and so on. In some embodiments, the signal EN2 is provided by other circuits of the Ethernet power supply device 100, such as the POR circuit. In some embodiments, the processor 140 is configured to obtain the settings of the second switch 120 in advance. For example, the settings of the second switch 120 is stored in the memory (not shown) of the Ethernet power supply device 100 in advance. According to the setting information from the signal POE2_PSE, the processor 140 is configured to provide a control signal POE2_Ctrl to the second switch 120, so as to control the voltage value, current value, and/or power level of the power supply POE2_O provided by the second switch 120. Therefore, when the Ethernet connection port 122 is connected to the network cable, the second switch 120 is configured to generate the power supply POE2_O corresponding to the control signal POE2_Ctrl according to the control signal POE2_Ctrl. Moreover, in response to the default value of the control signal POE2_Ctrl, the second switch 120 is configured to generate the power supply POE2_O with the voltage value POE2_V1, and the voltage value POE2_V1 is less than the voltage value POE1_V1.

The third power supply module 30 includes a connector 132 and a protection circuit 130. The protection circuit 130 is coupled between the connector 132 and the power output terminal 150. When an adapter (not shown) is connected to the connector 132, the protection circuit 130 is configured to provide the adapter power supply ADP_O to the power output terminal 150 according to the input power from the adapter. In some embodiments, the protection circuit 130 is further configured to provide the adapter power supply ADP_O to the first power supply module 10 and the second power supply module 20, so as to notify the first power supply module 10 and the second power supply module 20 not to provide the power supply POE1_O and the power supply POE2_O to the power output terminal 150 or to reduce the voltage values of the power supplies POE1_O and POE2_O, so that the power output terminal 150 is mainly powered by the adapter power supply ADP_O of the third power supply module 30.

Figure 2:
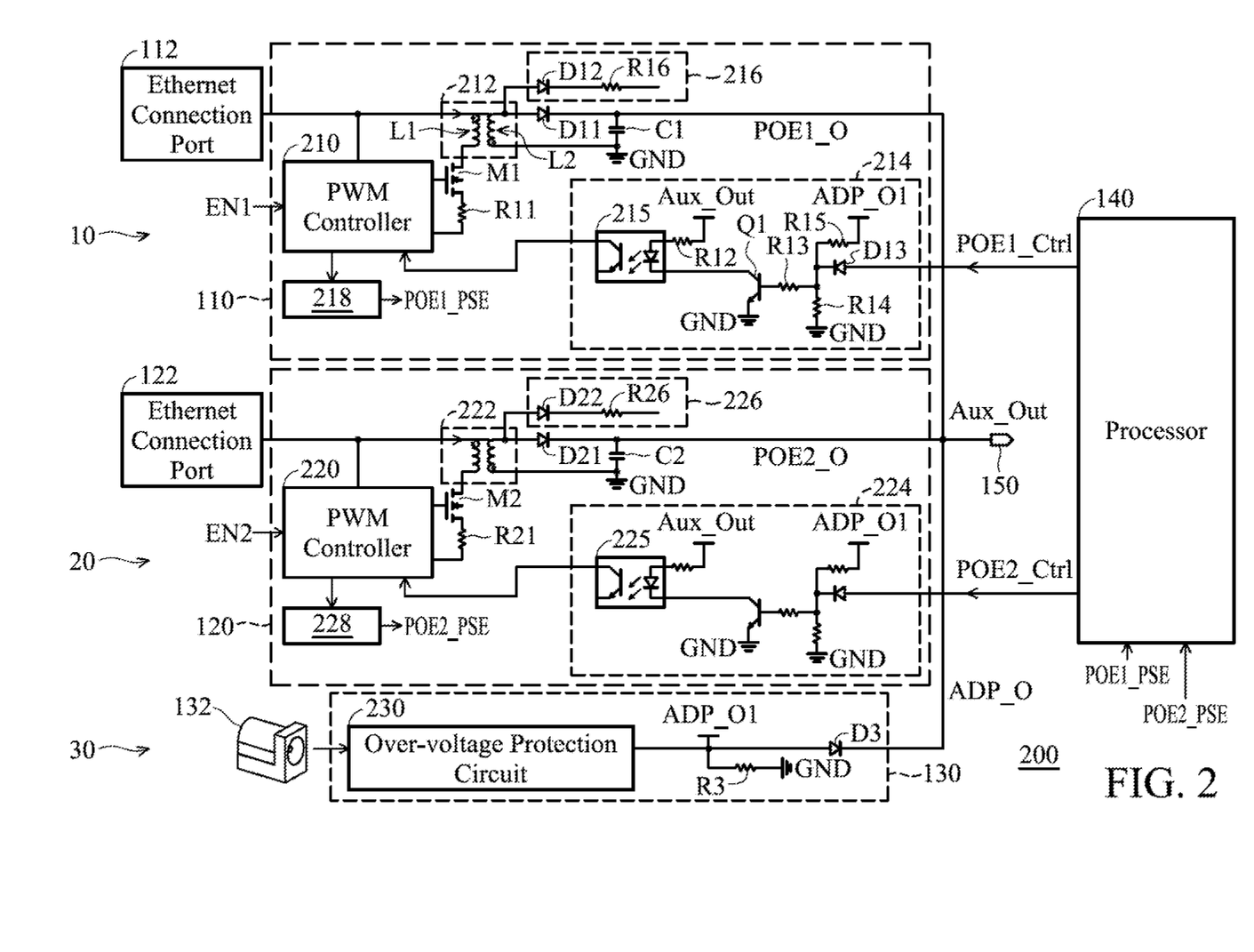
FIG. 2 shows an Ethernet power supply device according to some embodiments of the invention.

FIG. 2 shows an Ethernet power supply device 200 a according to some embodiments of the invention. The Ethernet power supply device 200 is the PSE for providing the output power supply Aux_Out to the powered device (not shown) through the power output terminal 150. In some embodiments, the power output terminal 150 of the Ethernet power supply device 200 is coupled to the powered device through a network cable.

The Ethernet power supply device 200 includes a first power supply module 10, a second power supply module 20, and a third power supply module 30. The first power supply module 10 and the second power supply module 20 are configured to convert the DC current from the Ethernet cable into various power supplies, and the third power supply module 30 is configured to provide the input power from the adapter to the power output terminal 150.

In FIG. 2, the first power supply module 10 includes the Ethernet connection port 112 and the first switch 110. The first switch 110 is coupled between the Ethernet connection port 112 and the power output terminal 150. In the Ethernet power supply device 200, the first switch 110 includes a pulse width modulation (PWM) controller 210, a switching device M1, a resistor R11, a transformer 212, a dummy load 216, a diode D11, and a capacitor C1. The transformer 212 includes a primary coil L1 and a secondary coil L2. The primary coil L1 is coupled between the Ethernet connection port 112 and the switching device M1, and the switching device M1 is coupled between the primary coil L1 and the resistor R11. Furthermore, the secondary coil L2 is coupled between the anode of the diode D11 and the ground GND, and the cathode of the diode D11 is coupled to the power output terminal 150. Moreover, the capacitor C1 is coupled between the cathode of the diode D11 and the ground GND. In such embodiment, the switching device M1 is formed by an N-type transistor. In addition, the ON/OFF state of the switching device M1 is controlled by the PWM signal from the PWM controller 210.

In some embodiments, when the switching device M1 is turned on, the network power from the Ethernet connection port 112 is provided to the transformer 212. Then, when the switching device M1 is turned off, the transformer 212 is configured to transfer the power stored in the primary coil L1 to the secondary coil L2. Furthermore, when the voltage on the secondary coil of the transformer 212 gradually increases, the voltage on the primary coil of the transformer 212 also increases. By continuously switching the switching device M1, the capacitor C1 is gradually charged to increase the power supply POE1_O to the set voltage level (i.e., the voltage value). In addition, the diode D11 is configured to prevent reverse current from flowing back from the capacitor C1 to the transformer 212.

In the first power supply module 10, the dummy load 216 includes a diode D12 and a resistor R16. The diode D12 is coupled between the resistor R16 and the secondary coil L2 of the transformer 212. The dummy load 216 is configured to prevent the power supply POE1_O from increasing instantaneously when the load of the power output terminal 150 suddenly decreases, which may easily damage components with low withstand voltage (e.g., the capacitor C1). In some embodiments, in applications where the power output terminal 150 has a stable load, the dummy load 216 may be omitted.

In the first power supply module 10, the first switch 110 is preset to provide the power supply POE1_O with the voltage value POE1_V1 (e.g., 12V). In response to the control signal POE1_Ctrl from the processor 140, the first switch 110 is configured to provide the power supply POE1_O with the voltage value POE1_V2 (e.g., 10V). It should be noted that the voltage value POE1_V2 is less than the voltage value POE1_V1, i.e., POE1_V2<POE1_V1. Similarly, in response to the control signal POE1_Ctrl, the first switch 110 is configured to provide the power supply POE1_O with a smaller voltage value.

In the Ethernet power supply device 200, the first switch 110 further includes a circuit 214 and a unit 218. The unit 218 is used to provide a switch setting POE1_PSE that informs the processor 140 about the power supply POE1_O of the first switch 110. In some embodiments, the switch setting POE1_PSE includes the output power level and/or voltage level range of the power supply POE1_O. In some embodiments, the unit 218 includes an optical coupler configured to provide electrical isolation between the first switch 110 and the processor 140.

In FIG. 2, the circuit 214 includes a unit 215, a resistor R12, a bipolar transistor Q1, a resistor R13, a resistor R14, a resistor R15, and a diode D13. It should be noted that the configuration of the components in the circuit 214 is only an example, and is not intended to limit the invention. According to the output power supply Aux_Out, the adapter power supply ADP_O1 from the protection circuit 130 and the control signal POE1_Ctrl from the processor 140, the circuit 214 is configured to control the power supply POE1_O of the first switch 110. For example, according to the switch setting POE1_PSE, the processor 140 is configured to provide the control signal POE1_Ctrl to the circuit 214 so as to control the voltage value of the power supply POE1_O of the first switch 110 through the circuit 214. In addition, according to the adapter power supply ADP_O1 and the output power supply Aux_Out, the circuit 214 is configured to determine whether the adapter is connected to the connector 132. In some embodiments, when it is determined that no adapter is connected to the connector 132, the circuit 214 is configured to control the first switch 110 to generate the power supply POE1_O with a larger voltage value. Conversely, when it is determined that the adapter is connected to the connector 132, the circuit 214 is configured to control the first switch 110 to generate the power supply POE1_O with a smaller voltage value or not to generate the power supply POE1_O. In some embodiments, the circuit 214 includes a unit 215, and the unit 215 is an optical coupler for providing electrical isolation between the first switch 110 and the processor 140.

In FIG. 2, the second power supply module 20 includes the Ethernet connection port 122 and the second switch 120. The second switch 120 is coupled between the Ethernet connection port 122 and the power output terminal 150. In the Ethernet power supply device 200, the second switch 120 includes a PWM controller 220, a switching device M2, a resistor R21, a transformer 222, a dummy load 226, a diode D21, and a capacitor C2, and the dummy load 226 includes a resistor R26 and diode D22. Similar to the dummy load 216 of the first switch 110, the dummy load 226 may be omitted in some applications. The configuration of the PWM controller 220, the transformer 222 and other components in the second switch 120 is similar to that of the first switch 110 in the first power supply module 10. In order to simplify the description, the description of the components in the second switch 120 is omitted.

In the Ethernet power supply device 200, the second switch 120 further includes a circuit 224 and a unit 228. The unit 228 is used to provide the switch setting POE2_PSE to notify the processor 140 about the power supply POE2_O of the second switch 120. In some embodiments, the switch setting POE2_PSE includes the output power level and/or voltage level range of the power supply POE2_O. In some embodiments, the unit 228 includes an optical coupler configured to provide electrical isolation between the second switch 120 and the processor 140.

In FIG. 2, the circuit 224 has components similar to the circuit 214 of the first switch 110. According to the output power supply Aux_Out, the adapter power supply ADP_O1 from the protection circuit 130 and the control signal POE2_Ctrl from the processor 140, the circuit 224 is configured to control the output of the power supply POE2_O of the second switch 120. For example, according to the switch setting POE2_PSE, the processor 140 is configured to provide the control signal POE2_Ctrl to the circuit 224 so as to control the voltage value of the power supply POE2_O of the second switch 120 through the circuit 224. Moreover, according to the adapter power supply ADP_O and the output power supply Aux_Out, the circuit 224 is configured to determine whether the adapter is connected to the connector 132. In some embodiments, the circuit 224 includes a unit 225, and the unit 225 is an optical coupler configured to provide electrical isolation between the second switch 120 and the processor 140.

In the second power supply module 20, the second switch 120 is preset to provide the power supply POE2_O with the voltage value of POE2_V1 (e.g., 10V). In response to the control signal POE2_Ctrl from the processor 140, the second switch 120 is configured to provide the power supply POE2_O with the voltage value POE2_V2 (e.g., 11.2V). It should be noted that the voltage value POE2_V2 is greater than the voltage value POE2_V1, i.e., POE2_V2>POE2_V1. In addition, the voltage value POE2_V1 of the second switch 120 is less than the voltage value POE1_V1 of the first switch 110, i.e., POE2_V1<POE1_V1. Furthermore, the voltage value POE1_V2 of the first switch 110 is less than the voltage value POE2_V2 of the second switch 120.

In FIG. 2, the third power supply module 30 includes a connector 132 and a protection circuit 130. The protection circuit 130 includes an over-voltage protection circuit 230, a resistor R3, and a diode D3. The over-voltage protection circuit 230 is coupled between the connector 132 and the anode of the diode D3. The resistor R3 is coupled between the anode of the diode D3 and the ground GND. The cathode of the diode D3 is coupled to the power output terminal 150. When the adapter (not shown) is connected to the connector 132, the over-voltage protection circuit 230 is configured to provide the adapter power supply ADP_O1 to the anode of the diode D3 and the first switch 110 and the second switch 120 (e.g., the resistor R15 of the circuit 214) according to the input power from the adapter. After the adapter power supply ADP_O1 turns on the diode D3, the adapter power supply ADP_O with the voltage value ADP_V is provided to the power output terminal 150. It should be noted that the voltage value ADP_V is equal to the voltage value POE1_V1 of the first switch 110, i.e., ADP_V=POE1_V1.

Figure 3:
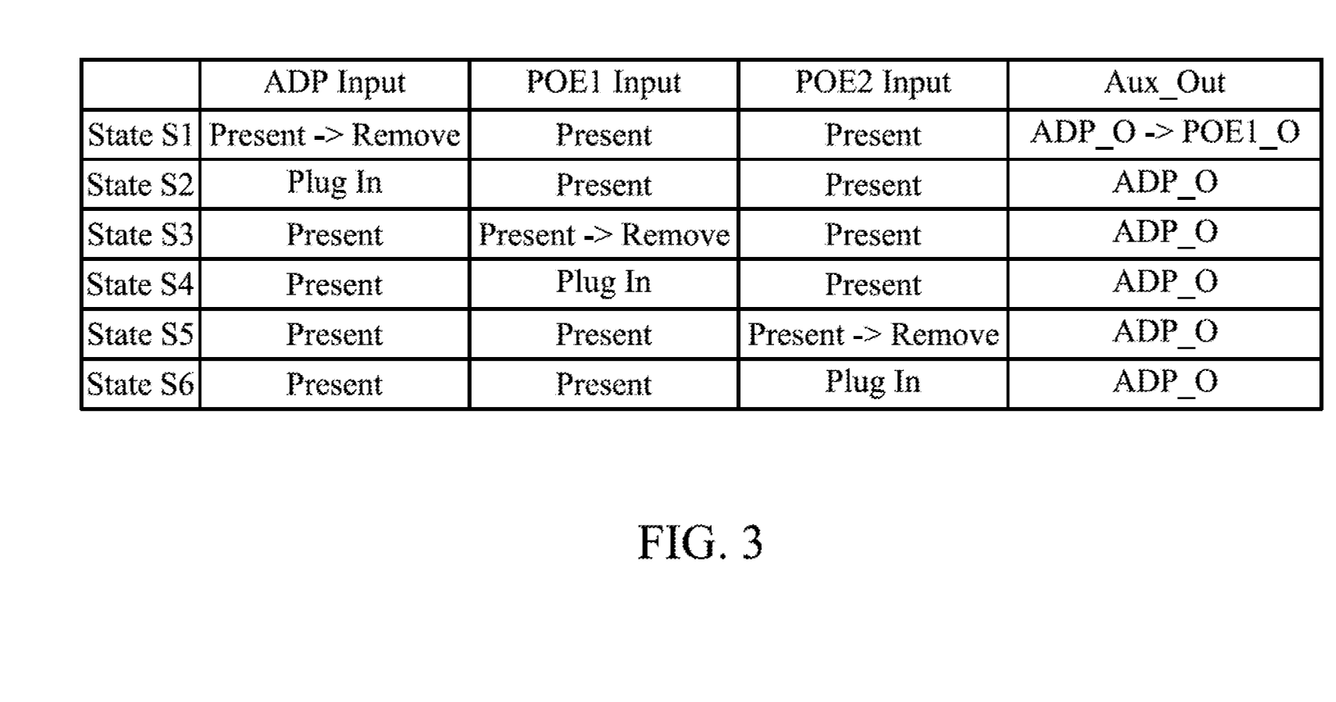
FIG. 3 shows a table illustrating power supply states of the Ethernet power supply devices in various states according to some embodiments of the invention.

FIG. 3 shows a table illustrating power supply states of the Ethernet power supply devices 100 and 200 in various states according to some embodiments of the invention. In FIG. 3, the first switch 110 of the first power supply module 10 and the second switch 120 of the second power supply module 20 are configured to provide the power supply POE1_O and the power supply POE2_O with the same power level. In addition, compared with the second power supply module 20, the first power supply module 10 has a higher priority to supply power.

When the adapter (not shown) is connected to the connector 132, the third power supply module 30 is configured to provide the adapter power supply ADP_O with the voltage value of ADP_V to the power output terminal 150 as the output power supply Aux_Out, as shown in state S2 to state S6. In other words, when the adapter is connected to the connector 132, the Ethernet power supply devices 100 and 200 are mainly powered by the third power supply module 30. When the adapter is removed from the connector 132, the first power supply module 10 is configured to provide the power supply POE1_O with the voltage value POE1_V1 to the power output terminal 150 as the output power supply Aux_Out, as shown in state S1. In other words, when the adapter is not connected to the connector 132, the Ethernet power supply devices 100 and 200 are mainly powered by the first power supply module 10. As described above, the voltage value ADP_V is equal to the voltage value POE1_V1, i.e., ADP_V=POE1_V1.

Figure 4:
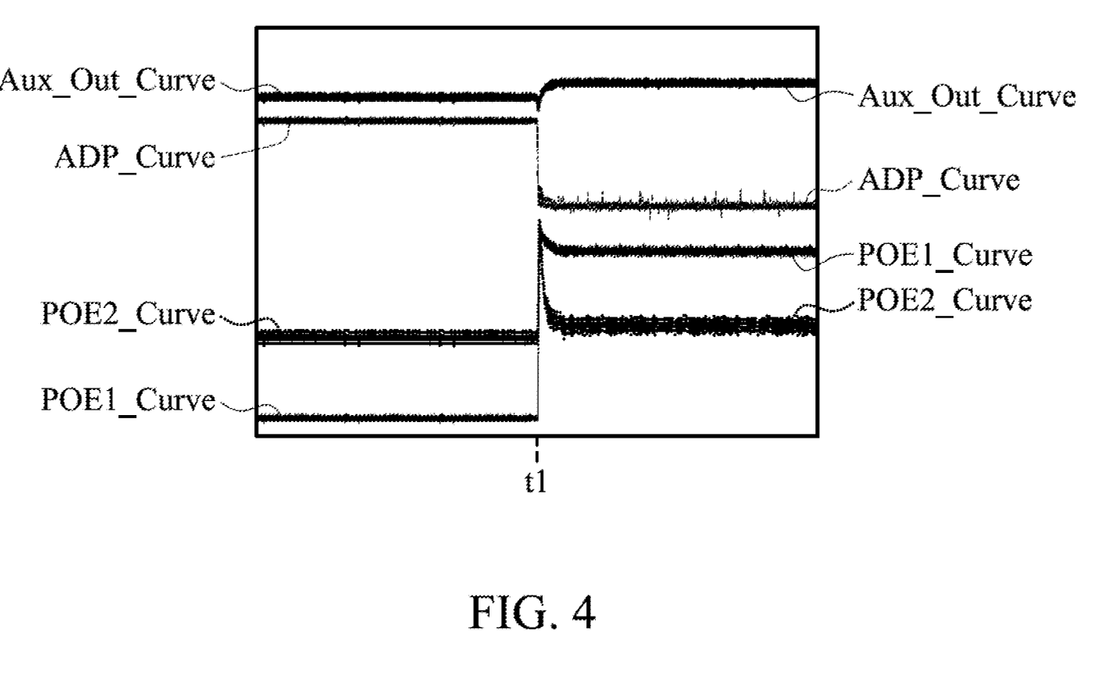
FIG. 4 shows a waveform diagram of the Ethernet power supply devices in state S1 of FIG. 3 according to some embodiments of the invention.

FIG. 4 shows a waveform diagram of the Ethernet power supply devices 100 and 200 in state S1 of FIG. 3 according to some embodiments of the invention. In FIG. 4, Aux_Out_Curve represents the voltage of the output power supply Aux_Out. ADP_Curve represents the voltage of the power supply ADP_O. POE1_Curve represents the output current of the power supply POE1_O, and POE2_Curve represents the output current of the power supply POE2_O. Before time t1, the adapter (not shown) is connected to the connector 132, and the output power supply Aux_Out is provided by the adapter power supply ADP_O of the third power supply module 30. At time t1, when the adapter is removed, the adapter power supply ADP_O is absent. At the same time, the output power supply Aux_Out is provided by the power supply POE1_O of the first power supply module 10 instead. At this time, the changed amplitude of the voltage of the output power supply Aux_Out is very small, so it can be ensured that the Ethernet power supply devices 100 and 200 can still supply the powered device stably after the adapter is removed.

Figure 5:
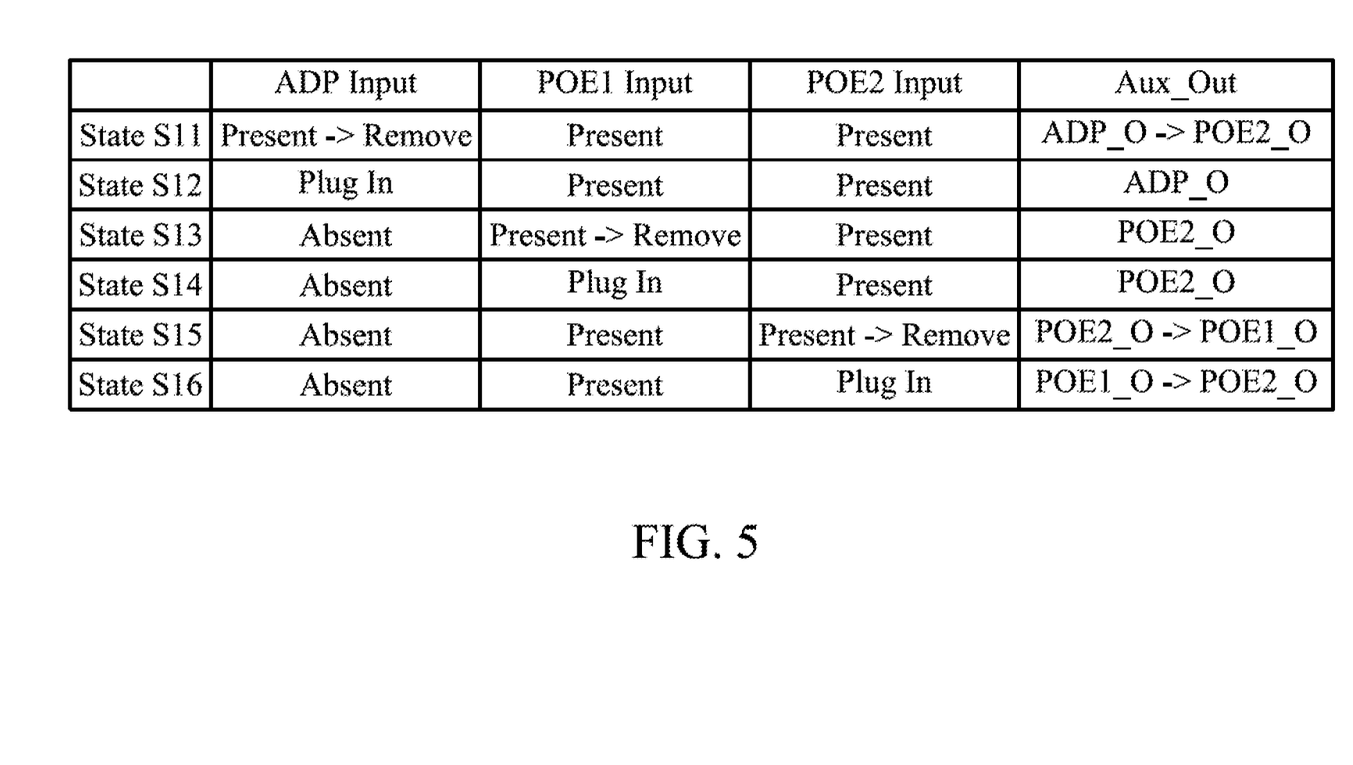
FIG. 5 shows a table illustrating power supply states of the Ethernet power supply devices in various states according to some embodiments of the invention.

FIG. 5 shows a table illustrating power supply states of the Ethernet power supply devices 100 and 200 in various states according to some embodiments of the invention. In FIG. 5, the second switch 120 of the second power supply module 20 has a higher power level. For example, the second switch 120 of the second power supply module 20 conforms to the 802.3bt specification, and the first switch 110 of the first power supply module 10 conforms to the 802.3at specification.

In FIG. 5, when the adapter (not shown) is connected to the connector 132, the third power supply module 30 is configured to provide the adapter power supply ADP_O to the power output terminal 150 as the output power supply Aux_Out, as shown in state S12. In other words, when the adapter is connected to the connector 132, the Ethernet power supply devices 100 and 200 are mainly powered by the third power supply module 30. When the adapter is removed from the connector 132, the second power supply module 20 with a higher output power level is configured to provide the power supply POE2_O with the voltage value POE2_V2 to the power output terminal 150 as the output power supply Aux_Out, as shown in state S11, S13 and S14. At this time, in some embodiments, the first power supply module 10 is configured to provide the power supply POE1_O with the voltage value POE1_V2, and the voltage value POE1_V2 is less than the voltage value POE2_V2. When the network cable is removed from the Ethernet connection port 122 of the second power supply module 20, the first power supply module 10 with a lower output power level is configured to provide the power supply POE1_O with the voltage value POE1_V1 to the power output terminal 150, as the output power supply Aux_Out, as shown in state S15. At this time, in some embodiments, the second power supply module 20 is configured to provide the power supply POE2_O with the voltage value POE2_V1, and the voltage value POE2_V1 is less than the voltage value POE1_V1. When the adapter is not connected to the connector 132 and the network cable is not connected to the Ethernet connection port 122, the first power supply module 10 with the lower power output level is configured to provide the power supply POE1_O to the power output terminal 150, as the output power supply Aux_Out until the network cable is plugged into the Ethernet connection port 122 of the second power supply module 20, as shown in state S16.

Figure 6:
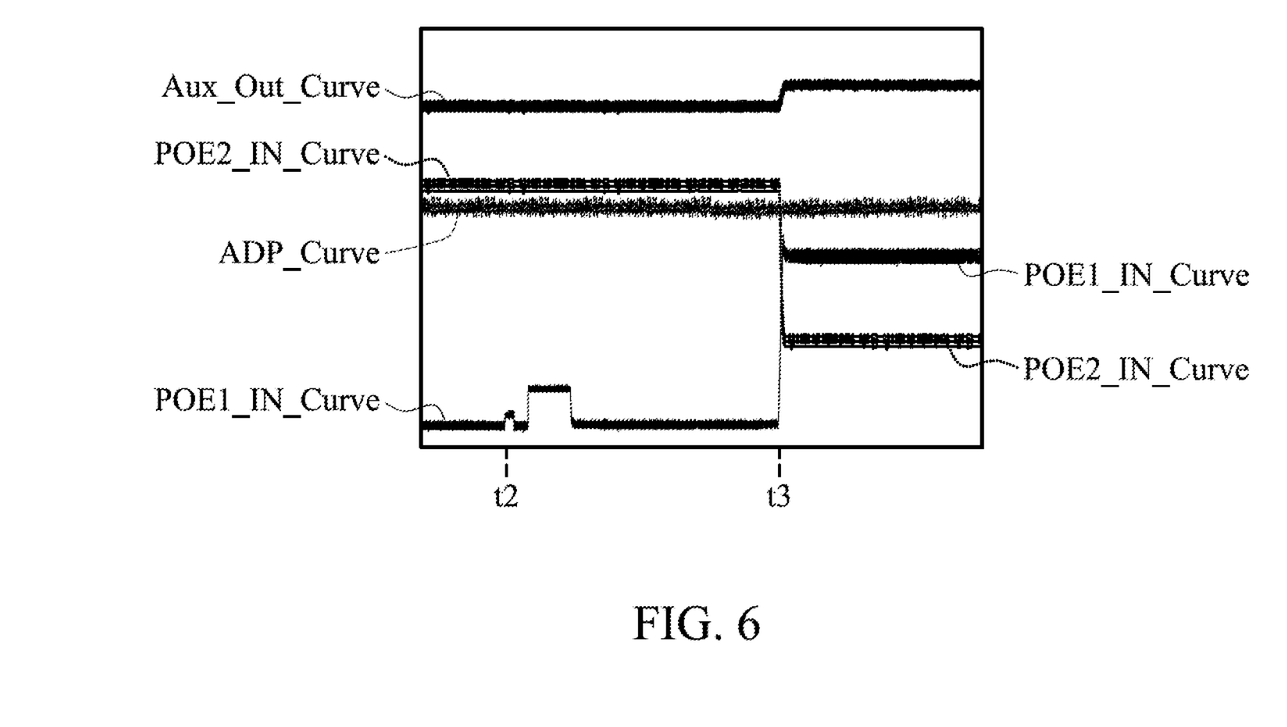
FIG. 6 shows the waveforms of the Ethernet power supply devices in states S14 and S15 of FIG. 5 according to some embodiments of the invention.

FIG. 6 shows the waveforms of the Ethernet power supply devices 100 and 200 in states S14 and S15 of FIG. 5 according to some embodiments of the invention. In FIG. 6, Aux_Out_Curve represents the voltage of the output power supply Aux_Out. ADP_Curve represents the voltage of the power supply ADP_O. POE1_IN_Curve represents the input current of the first switch 110, and POE2_IN_Curve represents the input current of the second switch 120. In FIG. 6, the adapter (not shown) is not connected to the connector 132 and the network cable is plugged into the Ethernet connection port 122, so the power supply ADP_O is absent (e.g., the voltage level of ADP_Curve is 0) and the output power supply Aux_Out is provided by the power supply POE2_O of the second power supply module 20. At time t2, the network cable is plugged into the Ethernet connection port 112 of the first power supply module 10, and the output power supply Aux_Out is still provided by the power supply POE2_O of the second power supply module 20, so the output power supply Aux_Out will not be affected. At time t3, the network cable is removed from the Ethernet connection port 122, so the second power supply module 20 is configured to stop providing the power supply POE2_O, and the first power supply module 10 is configured to provide the power supply POE1_O as the output power supply Aux_Out. Therefore, the output power supply Aux_Out will not be affected by the removed second power supply module 20 and the output power supply Aux_Out can still supply power to the powered device stably.

Figure 7:
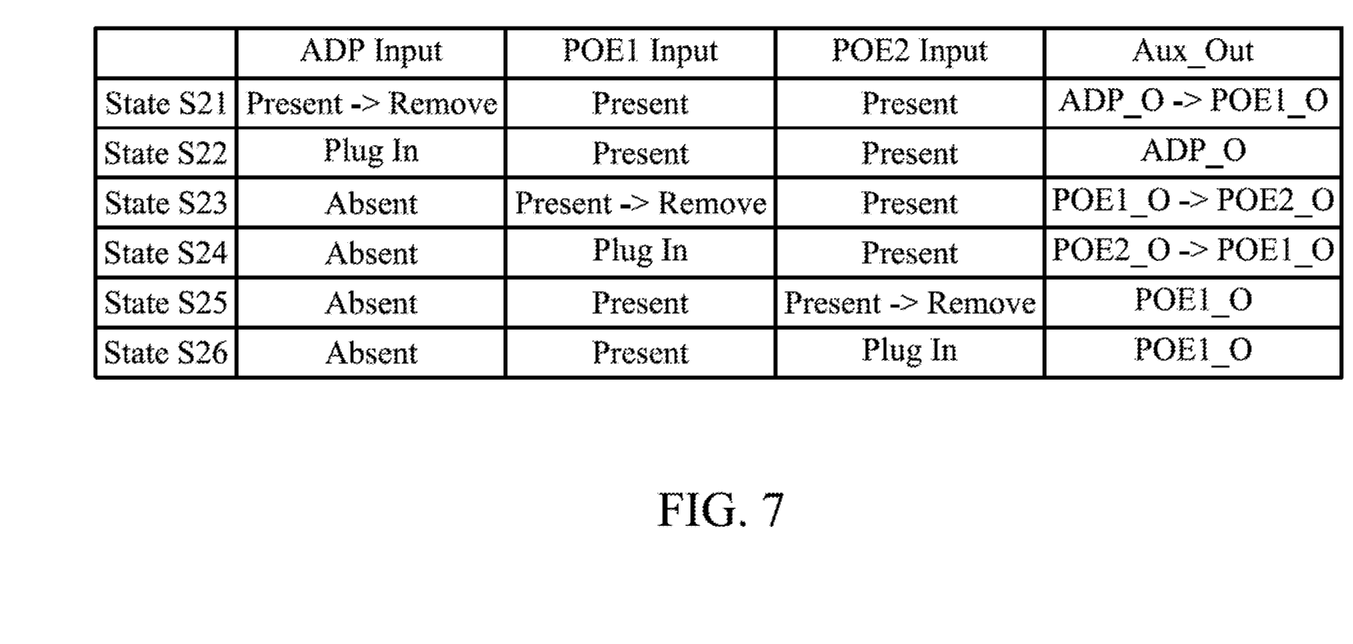
FIG. 7 shows a table illustrating the power supply states of the Ethernet power supply devices in various states according to some embodiments of the invention.

FIG. 7 shows a table illustrating the power supply state of the Ethernet power supply devices 100 and 200 in various states according to some embodiments of the invention. In FIG. 7, the second switch 120 of the second power supply module 20 has a higher power level. For example, the second switch 120 of the second power supply module 20 conforms to the 802.3bt specification, and the first switch 110 of the first power supply module 10 conforms to the 802.3at specification. In addition, when the adapter (not shown) is not connected to the connector 132, the processor 140 enters a sleep mode. In the sleep mode, the first power supply module 10 has a higher power supply priority than the second power supply module 20, that is, the default switch of the Ethernet power supply devices 100 and 200 is the first switch 110 of the first power supply module 10.

In FIG. 7, when the adapter (not shown) is connected to the connector 132, the third power supply module 30 is configured to provide the adapter power supply ADP_O to the power output terminal 150 as the output power supply Aux_Out, as shown in state S22. In other words, when the adapter is connected to the connector 132, the Ethernet power supply devices 100 and 200 are mainly powered by the third power supply module 30. When the adaptor is removed from the connector 132 or the adaptor is not connected to the connector 132, the first power supply module 10 with higher output priority is configured to provide the power supply POE1_O to the power output terminal 150 as the output power supply Aux_Out, as shown in states S21, S25 and S26. When the network cable is removed from the Ethernet connection port 112 of the first power supply module 10, the second power supply module 20 with a lower output priority is configured to provide the power supply POE2_O to the power output terminal 150 as the output power supply Aux_Out, as shown in state S23. Furthermore, when the adapter is not connected to the connector 132 and the second power supply module 20 is powered, once the network cable is connected to the Ethernet connection port 112 of the first power supply module 10, the first power supply module 10 with high output priority is configured to provide the power supply POE1_O to the power output terminal 150 as the output power supply Aux_Out, as shown in state S24.

Figure 8:
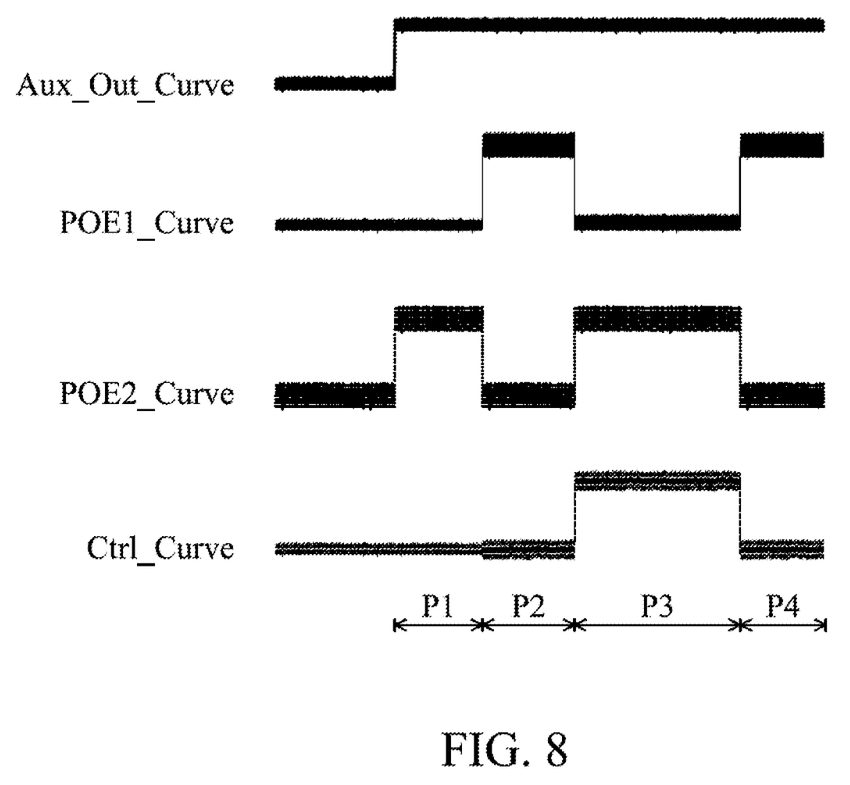
FIG. 8 shows a waveform diagram of the Ethernet power supply devices in different states according to some embodiments of the invention.

FIG. 8 shows a waveform diagram of the Ethernet power supply devices 100 and 200 in different states according to some embodiments of the invention. In FIG. 8, Aux_Out_Curve represents the voltage of the output power supply Aux_Out. POE1_Curve represents the output current of the power supply POE1_O, and POE2_Curve represents the output current of the power supply POE2_O. Ctrl_Curve represents the signal POE2_Ctrl. In time period P1, the network cable is only connected to the Ethernet connection port 122 of the second power supply module 20, so the second power supply module 20 is configured to provide the power supply POE2_O to the power output terminal 150 as the output power supply Aux_Out. In time period P2, the network cable is connected to the Ethernet connection port 112 of the first power supply module 10 with higher output priority, so the first power supply module 10 is configured to provide the power supply POE1_O to the power output terminal 150, as the output power supply Aux_Out. Next, the processor 140 obtains from the switch settings POE1_PSE and POE2_PSE that the second power supply module 20 has a larger output power. Then, in time period P3, the processor 140 is configured to provide the control signal POE2_Ctrl to the second power supply module 20 so as to control the second power supply module 20 to provide the power supply POE2_O to the power output terminal 150 as the output power supply Aux_Out. In addition, the processor 140 is also configured to provide the control signal POE1_Ctrl to the first power supply module 10 so as to control the first power supply module 10 not to supply power to the power output terminal 150. In time period P4, the processor 140 enters the sleep mode, and therefore no control signals POE1_Ctrl and POE2_Ctrl are provided to the first power supply module 10 and the second power supply module 20. Therefore, the first power supply module 10 with a higher output priority is configured to provide the power supply POE1_O to the power output terminal 150 as the output power supply Aux_Out.

According to the embodiments of the invention, by using multiple switches and controlling the voltage value of the power output of the PSE according to a preset priority or output power level, the Ethernet power supply device can provide the stable output power supply Aux_Out to the powered device when the adapter is removed from the connector 132. Therefore, the powered device can perform the hot backup operation normally when the different switches of the Ethernet power supply device are configured to supply power. Compared with the traditional Ethernet power supply device, no additional power switches and capacitors are arranged in the path of the power output terminal 150 of the Ethernet power supply device of the embodiments of the invention.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An Ethernet power supply device, comprising:
a power output terminal configured to provide an output power supply;
a connector;
a first Ethernet connection port;
a first switch coupled between the first Ethernet connection port and the power output terminal, and configured to detect whether an adapter power supply from the connector is present, and to generate a first power supply according to a first control signal and a first network power from the first Ethernet network connection port when the adapter power supply is absent, wherein the first switch comprises:
a first pulse width modulation (PWM) controller coupled to the first Ethernet connection port, and configured to provide a first PWM signal according to the first control signal;
a first transformer coupled between the first Ethernet connection port and the power output terminal; and
a first switching device coupled between the first transformer and the first PWM controller, wherein the first switching device is controlled by the first PWM signal;
a second Ethernet connection port;
a second switch coupled between the second Ethernet connection port and the power output terminal, and configured to detect whether the adapter power supply from the connector is present, and generate a second power supply according to a second control signal and a second network power from the second Ethernet network connection port when the adapter power supply is absent, wherein the second switch comprises:
a second PWM controller coupled to the second Ethernet connection port, and configured to provide a second PWM signal according to the second control signal;
a second transformer coupled between the second Ethernet connection port and the power output terminal; and
a second switching device coupled between the second transformer and the second PWM controller, wherein the second switching device is controlled by the second PWM signal; and
a processor configured to provide the first control signal and the second control signal,
wherein when the adapter power supply is absent and the first power supply and the second power supply have the same power level with different voltages, and wherein voltage of the first power supply is greater than voltage of the second power supply, the processor is configured to provide the first control signal to control the first switch to provide the first power supply to the power output terminal as the output power supply,
wherein when the adapter power supply is absent and power level of the second power supply is greater than that of the first power supply, the processor is configured to provide the second control signal to control the second switch to provide the second power supply to the power output terminal as the output power supply.

2. The Ethernet power supply device as claimed in claim 1, further comprising:
a first diode having an anode and a cathode coupled to the power output terminal; and
an over-voltage protection circuit coupled between the connector and the anode of the first diode, wherein when an adapter is connected to the connector, the over-voltage protection circuit is configured to provide the adapter power supply to the first diode, the first switch, and the second switch.

3. The Ethernet power supply device as claimed in claim 2, wherein when the adapter is not connected to the connector, the first switch and the second switch detect that the adapter power supply from the over-voltage protection circuit is absent.

4. The Ethernet power supply device as claimed in claim 1, wherein when the first switch provides the first power supply to the power output terminal as the output power supply, once the first switch detects that the adapter power supply is present, the first switch is configured to stop providing the first power supply to the power output terminal or to decrease the voltage of the first power supply.

5. The Ethernet power supply device as claimed in claim 1, wherein when the second switch provides the second power supply to the power output terminal as the output power supply, once the second switch detects that the adapter power supply is present, the second switch is configured to stop providing the second power supply to the power output terminal or to decrease the voltage of the second power supply.

6. The Ethernet power supply device as claimed in claim 1, wherein when the first switch and the second switch detect that the adapter power supply is present, the adapter power supply is provided to the power output terminal as the output power supply.

7. The Ethernet power supply device as claimed in claim 1, wherein the processor obtains power level and voltage settings of the first power supply according to a first signal from the first switch, and the processor obtains power level and voltage settings of the second power supply according to a second signal from the second switch.

8. The Ethernet power supply device as claimed in claim 7, wherein the processor provides the first control signal to the first switch according to the power level and the voltage settings of the first power supply of the first signal, and the processor provides the second control signal to the second switch according to the power level and the voltage settings of the second power supply of the second signal.

9. The Ethernet power supply device as claimed in claim 1, wherein when power level of the second power supply is greater than that of the first power supply, the processor further provides the first control signal to control the first switch to decrease the voltage of the first power supply.

10. An Ethernet power supply device, comprising:
a power output terminal;
a connector;
a plurality of Ethernet connection ports; and
a plurality of switches, wherein each of the switches is coupled between a respective Ethernet connection port and the power output terminal, and each of the switches comprises:
a pulse width modulation (PWM) controller coupled to the Ethernet connection port;
a switching device, wherein the switching device is controlled by a PWM signal of the PWM controller;
a first diode, having an anode and a cathode coupled to the power output terminal;
a capacitor coupled between the power output terminal and a ground;
a transformer, comprising:
a primary coil coupled between the Ethernet connection port and the switching device; and
a secondary coil coupled between the anode of the first diode and the ground; and
a first unit, comprising a first optical coupler coupled between the PWM controller and the power output terminal and a resistor coupled to the connector, and configured to determine whether an adapter power supply of the connector is present,
wherein when the first unit determines that the adapter power supply is absent, the transformer is configured to provide an output power supply to the power output terminal according to a network power of the Ethernet connection ports,
wherein when the adapter power supply is absent, the output power supply provided by each of the switches has an individual voltage level.

11. The Ethernet power supply device as claimed in claim 10, further comprising:

a processor,
wherein each of the switches further comprises:
a second unit, comprising a second optical coupler coupled between the processor and the PWM controller, and configured to notify the processor of a switch setting of power level and voltage level range of the switch.

12. The Ethernet power supply device as claimed in claim 11, wherein according to the switch setting, the processor is configured to provide a control signal to the first unit of the corresponding switch, so as to control the PWM controller to adjust the PWM signal, so as to adjust the voltage level of the output power supply.

13. The Ethernet power supply device as claimed in claim 11, wherein the processor obtains power level and voltage of the corresponding switch according to a signal from each of the switches.

14. The Ethernet power supply device as claimed in claim 11, wherein the first optical coupler is further configured to provide electrical isolation between the switch and the processor.

15. The Ethernet power supply device as claimed in claim 11, wherein the second optical coupler is further configured to provide electrical isolation between the switch and the processor.

16. The Ethernet power supply device as claimed in claim 10, further comprising:
a second diode having an anode and a cathode coupled to the power output terminal; and
an over-voltage protection circuit coupled between the connector and the anode of the second diode,
wherein when an adapter is connected to the connector, the over-voltage protection circuit provides the adapter power supply to the second diode and each of the switches.

17. The Ethernet power supply device as claimed in claim 12, wherein when a first switch of the switches provides a first power supply to the power output terminal as the output power supply according to the control signal, once the first switch detects that the adapter power supply is present, the first switch is configured to stop providing the first power supply to the power output terminal or to reduce the voltage level of the first power supply.

18. The Ethernet power supply device as claimed in claim 12, wherein when a second switch of the switches provides a second power supply to the power output terminal as the output power supply according to the control signal, once the second switch detects that the adapter power supply is present, the second switch is configured to stop providing the second power supply to the power output terminal or to reduce the voltage level of the second power supply.

19. The Ethernet power supply device as claimed in claim 10, wherein when each of the switches detects that the adapter power supply is present, the adapter power supply is provided to the power output terminal as the output power supply.

20. The Ethernet power supply device as claimed in claim 10, wherein the output power supply provided by each of the switches has an individual power level.

* * * * *